(12) United States Patent
Saylor et al.

(10) Patent No.: US 7,145,339 B2
(45) Date of Patent: Dec. 5, 2006

(54) METHOD AND APPARATUS FOR DISCRETE SHIELDING OF VOLUME RFCOIL ARRAYS

(75) Inventors: Charles A. Saylor, Gainesville, FL (US); G. Randy Duensing, Gainesville, FL (US)

(73) Assignee: Invivo Corporation, Gainesville, FL (US)

( * ) Notice: Subject to any disclaimer, the term of this patent is extended or adjusted under 35 U.S.C. 154(b) by 21 days.

(21) Appl. No.: 11/245,500

(22) Filed: Oct. 7, 2005

(65) Prior Publication Data

US 2006/0076955 A1 Apr. 13, 2006

Related U.S. Application Data

(60) Provisional application No. 60/617,152, filed on Oct. 7, 2004.

(51) Int. Cl.
*G01V 3/00* (2006.01)
(52) U.S. Cl. .................................. 324/318; 324/322
(58) Field of Classification Search ............... 324/318, 324/322
See application file for complete search history.

(56) References Cited

U.S. PATENT DOCUMENTS

| | | | |
|---|---|---|---|
| 4,751,464 A | 6/1988 | Bridges | |
| 4,812,761 A | 3/1989 | Vaughan, Jr. | |
| 4,888,555 A | 12/1989 | Vaughan et al. | |
| 5,363,845 A | 11/1994 | Chowdhury et al. | |
| 5,557,247 A | 9/1996 | Vaughn | |
| 5,574,372 A | 11/1996 | Moritz et al. | |
| 5,744,957 A | 4/1998 | Vaughan, Jr. | |
| 5,886,596 A | 3/1999 | Vaughan, Jr. | |
| 6,008,650 A * | 12/1999 | Behbin .................... | 324/318 |
| 6,107,974 A * | 8/2000 | Votruba et al. ............. | 343/787 |
| 6,404,201 B1 | 6/2002 | Boskamp | |

(Continued)

FOREIGN PATENT DOCUMENTS

EP 0084946 A1 8/1983

(Continued)

OTHER PUBLICATIONS

Lu, Dongfeng, et al., A Technique of Double-Resonant Operation of $^{19}$F and $^{1}$H Quadrature Birdcage Coils, Magnetic Resonance in Medicine, May 1991, pp. 180-185, vol. 19, Duluth MN, USA.

*Primary Examiner*—Louis M. Arana
(74) *Attorney, Agent, or Firm*—Saliwanchik, Lloyd & Saliwanchik

(57) ABSTRACT

The subject invention pertains to a technique and device that can isolate and separate resultant electromagnetic fields of volume coils at high frequency. In an embodiment, an RF shield can be used to isolate and separate resultant electromagnetic fields. In an embodiment, the shield can have a cylindrical shape that can form a partially closed volume in which an object to be imaged, or sample, can be inserted. In an embodiment, the RF shield can be part of a RF coil. In a specific embodiment, some parts of a volume coil can be inside a shield, and the other parts of a volume coil can be outside the shield. The shielding of some of the parts of a volume coil can create conductor patterns corresponding to the specific parts inside the shield and the specific parts outside the shield. In an embodiment, two or more conductor patterns can be placed in proximity to the same shield and either be driven independently, driven together, or act as receiving elements, combined or uncombined. This embodiment is advantageous because the combination of conductor patterns can be optimized by the flexibility of separating the fields of end-rings from the fields of leg currents.

34 Claims, 4 Drawing Sheets

U.S. PATENT DOCUMENTS

| | | |
|---|---|---|
| 6,633,161 B1 | 10/2003 | Vaughan, Jr. |
| 2002/0070828 A1 | 6/2002 | Vaughan |
| 2003/0146750 A1 | 8/2003 | Vaughan |
| 2003/0222832 A1 | 12/2003 | Greim |
| 2004/0012391 A1 | 1/2004 | Vaughan |
| 2004/0027128 A1 | 2/2004 | Vaughan |
| 2004/0030238 A1 | 2/2004 | Vaughan |
| 2004/0140808 A1 | 7/2004 | Vaughan |

FOREIGN PATENT DOCUMENTS

| | | |
|---|---|---|
| EP | 0239147 A1 | 9/1987 |
| JP | 2001 128956 A | 5/2001 |
| WO | WO-1997-006723 | 2/1997 |
| WO | WO-1997-008788 | 3/1997 |
| WO | WO-2000-072033 | 11/2000 |
| WO | WO 03/36318 A1 | 5/2003 |
| WO | WO-2003-089947 | 10/2003 |

\* cited by examiner

METHOD AND APPARATUS FOR DISCRETE SHIELDING OF VOLUME RFCOIL ARRAYS

CROSS-REFERENCE TO RELATED APPLICATION

This application claims the benefit of U.S. Provisional Application Ser. No. 60/617,152, filed Oct. 7, 2004, which is hereby incorporated by reference herein in its entirety, including any figures, tables, or drawings.

BACKGROUND OF INVENTION

Embodiments of the subject invention pertain to the field of shielding of RF coil arrays in magnetic resonance (MR) imaging at high frequencies. Currently, shielded birdcage coils and transverse electromagnetic (TEM) coils (or transmission line resonators) are the most widely used volume coils for MR imaging using static magnetic fields of 4 T and above. A birdcage coil typically has a plurality of conductor elements (legs), which run parallel to each other from one end of the volume coil to the other end. At each end of the birdcage coil, the legs are electrically connected to an end ring, which is a closed ring in electrical contact with each leg conductor. In contrast, a TEM coil typically has a plurality of conductor elements (legs), which run parallel to each other from one end of the volume coil to the other end and are not electrically connected at each end of the TEM coil. In this way, each leg of a TEM coil can be driven independently of the others.

Additionally, surface coils or transmission line resonators are often used in a collection of weakly coupled elements that can be driven simultaneously to provide volume-like effects, with the ability to adjust the magnetic field by controlling the amplitude and phase of the drive for each element. The principle advantage of the birdcage coil is that it produces a relatively uniform field (in the unloaded state) and maintains a strong separation between modes because of the relatively strong coupling between adjacent meshes. This makes the field of a particular mode less sensitive to perturbation by errors in symmetry or loading properties of the sample. By contrast, the TEM coil has weaker coupling and, therefore, several modes of fairly low Q can interact, thus requiring multiple locations for drives in order to produce the desired field. For a specific sample the TEM coil can be adjusted to compensate for asymmetries in construction and the effects of the sample loading.

A convenient way to model bulk interactions of samples and volume coils at high frequency is to consider the sample and shield of the coil or bore through the formalism of cavity resonators and waveguides. Introduction of the sample into the volume of the volume coil can change the resonate wavelength and create standing waves and modes. This effect kicks in for a certain frequency to sample size ratio (e.g., when sample is on the order of a wavelength). Application of this analysis demonstrates that the TEM current elements couple differently to various cavity resonant modes than a birdcage coil, because of the end-ring currents of the birdcage.

DETAILED DISCLOSURE

Figure 1:
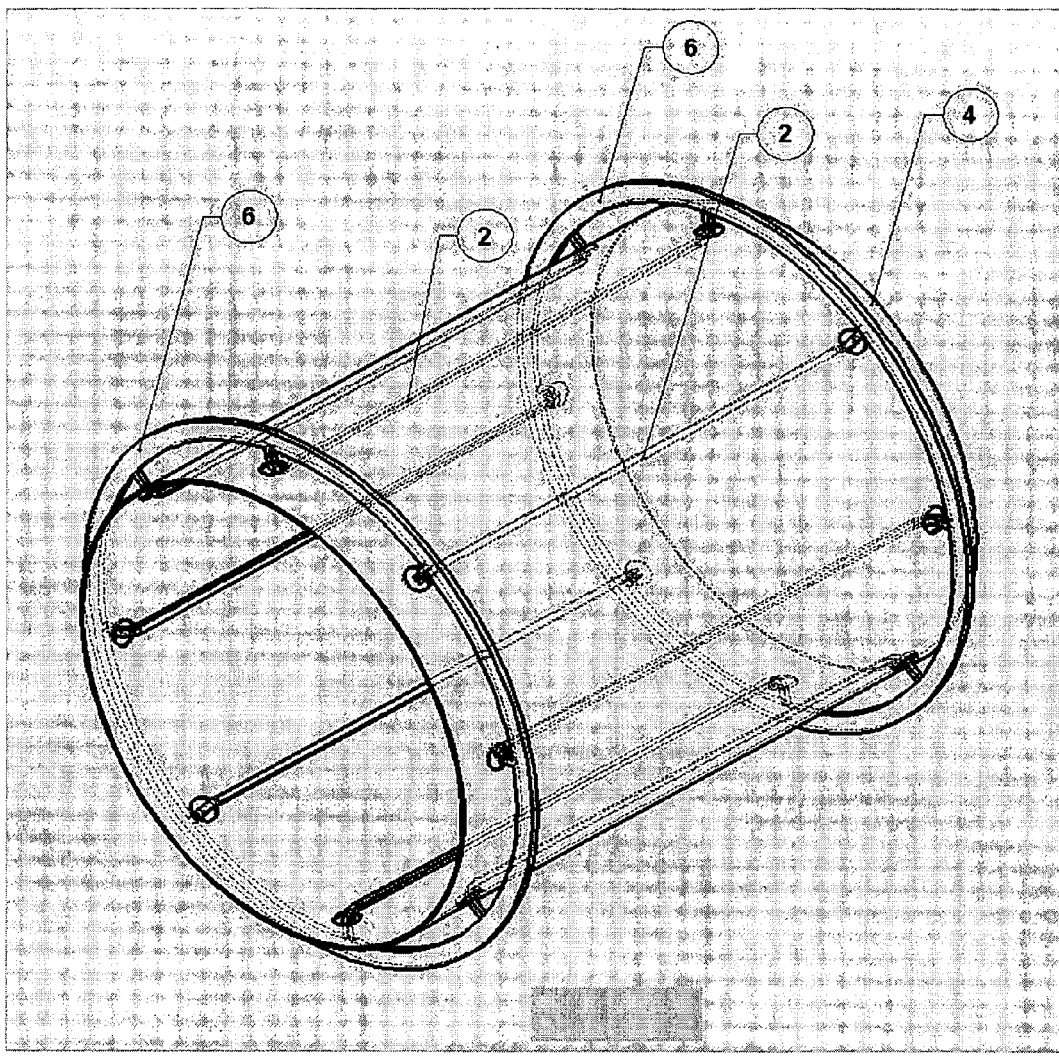
FIG. 1 shows an embodiment of the subject invention incorporating a birdcage coil with leg conductors inside the shield and end-ring conductors outside the shield.

Embodiments of the subject invention pertain to a method and apparatus for shielding RF coil arrays. Embodiments of the subject invention can allow isolation and separation of electromagnetic fields from conductive elements of RF volume coil arrays at high frequency. In an embodiment, an RF shield can be used to isolate and separate electromagnetic fields from various conductive elements. Embodiments of the subject method and apparatus can allow the shielding of some, but not all, of the conductive elements of a RF coil array. Embodiments of the invention can be used with static magnetic fields of 4 T and above, and frequencies corresponding thereto. The size of the coil structure can be determined such that the coil structure resonates at the corresponding frequency, based on the magnitude of the static magnetic field.

Embodiments can allow separation of the resultant fields from the end-rings and leg currents of a birdcage type coil array and the driving of these separately. The shield can incorporate a conductive layer positioned to form the desired shape of the shield. In a specific embodiment, the shield can have a cylindrical shape that can form a partially closed volume in which an object to be imaged, or sample, can be inserted. For example, the shield can form shapes such as, but is not limited to, a circular cylinder, an elliptical cylinder, a rectangular cylinder, or a paraboloid. In a specific embodiment, the conductive layer can be designed to shield RF magnetic fields and allow the passage of fields at the frequencies of the gradient fields utilized in MR imaging. In a specific embodiment, the conductive layer can have a thickness greater than or equal to five skin depths at the RF frequencies. In other embodiments, the conductive layer can have a thickness greater than or equal to five skin depths at the RF frequencies and a thickness less than five skin depths at the gradient fields frequencies. A cylindrical shield can tend to limit RF fields generated within the partially closed volume of the shield from reaching outside the partially closed volume of the shield at a position between the two ends of the shield and outside the radius of the shield. With such a cylindrical shield, fields can exist, either standing or traveling, along the axis of the cylinder out either end of the structure. In additional embodiments, one or both ends of the cylindrical shield can incorporate a conductive layer across a portion or all of the cylinder, which can tend to limit RF fields generated within the partially closed volume of the shield from reaching outside the end of the shield structure.

In an embodiment, a shield in accordance with the subject invention can produce currents that can oppose source currents and limit the fields generated on the other side of the shield. These currents can be considered "canceling" currents. The shield can function by providing low impedance conductive paths that can allow the desired "canceling" currents to be produced. In an embodiment, the shield can be completely continuous. In alternate embodiments, the shield can have holes or other discontinuities and still permits the "canceling" current pattern to be formed. In an embodiment, the shield can utilize tubular conductors located in proximity to the legs, or conductive elements, of the coil array. The size and shape of the shield can be such so as to follow the expected current pattern of the coil array and function as a shield. If the current to be driven with respect to the coil array is known then the current on the shield is predictable and the shield can be shaped accordingly. Preferably, the subject shield reduces or prevents the penetration of RF fields through the shield material, but allows gradient fields to pass through. In this way, the shield can reduce or prevent penetration of RF fields produced by RF coils outside of the shielded volume into the shielded volume and prevent penetrating of RF fields produced by RF coils inside of the shielded volume outside the shielded volume, while allowing gradient fields produced by gradient coils to pass, for example, from outside the shielded volume into the shielded volume.

Figure 2:
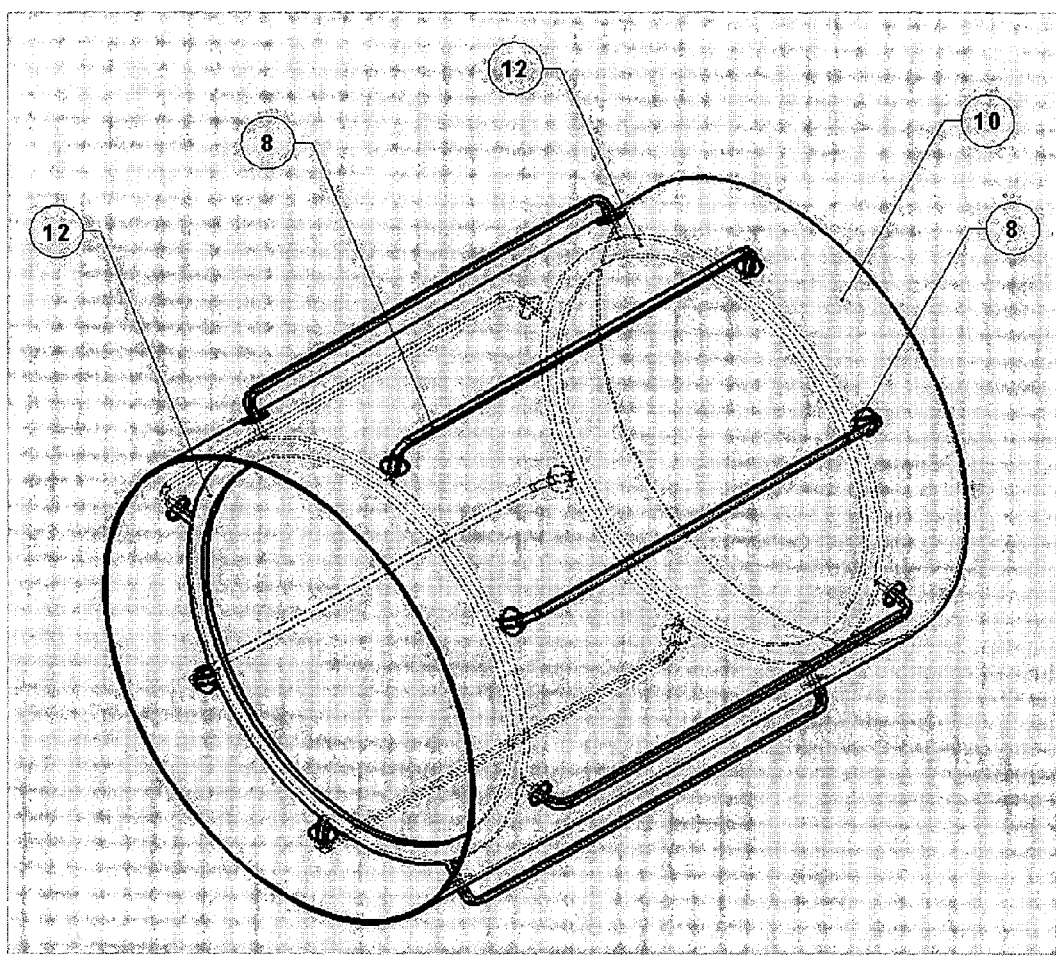
FIG. 2 shows an embodiment of the subject invention incorporating a birdcage coil with leg conductors outside the shield and end-ring conductors inside the shield.

In an embodiment, some parts of a volume coil, such as a birdcage coil, can be inside a shield, and other parts of the volume coil can be outside the shield. Currents on conductors inside the shield are primarily responsible for producing the electromagnetic fields inside the shield and, therefore, inside the sample. Currents on conductors outside the shield tend to have little impact on the fields inside the cylinder, but the conductors outside of the shield can still be part of the coil circuit electrically. In embodiments, at certain frequencies portions of the volume coil can be capacitively, or electrically, connected by being close enough to each other even though not physically touching. In other embodiments, capacitors can be used to capacitively, or electrically, connect two portions of the volume coil. The shielding of some of the parts of a volume coil can create conductor patterns corresponding to the specific parts inside the shield and the other specific parts outside the shield. Referring to FIG. 1, in a specific embodiment, the leg conductors 2 of a birdcage coil can be located inside a shield 4 and the end-rings 6 of the birdcage coil can be located outside the shield. In this embodiment, the strong coupling and, therefore, discrete mode behavior of the birdcage coil can be retained while producing the effective field inside the shield of only the leg portions. Accordingly, the resultant fields inside the shield would be similar to those of a TEM coil inside the cylinder. Referring to FIG. 2, in another embodiment, the leg conductors 8 of the birdcage can be placed outside the shield 10 and one or both end-rings 12 of the birdcage can be located inside the shield.

Figure 3:
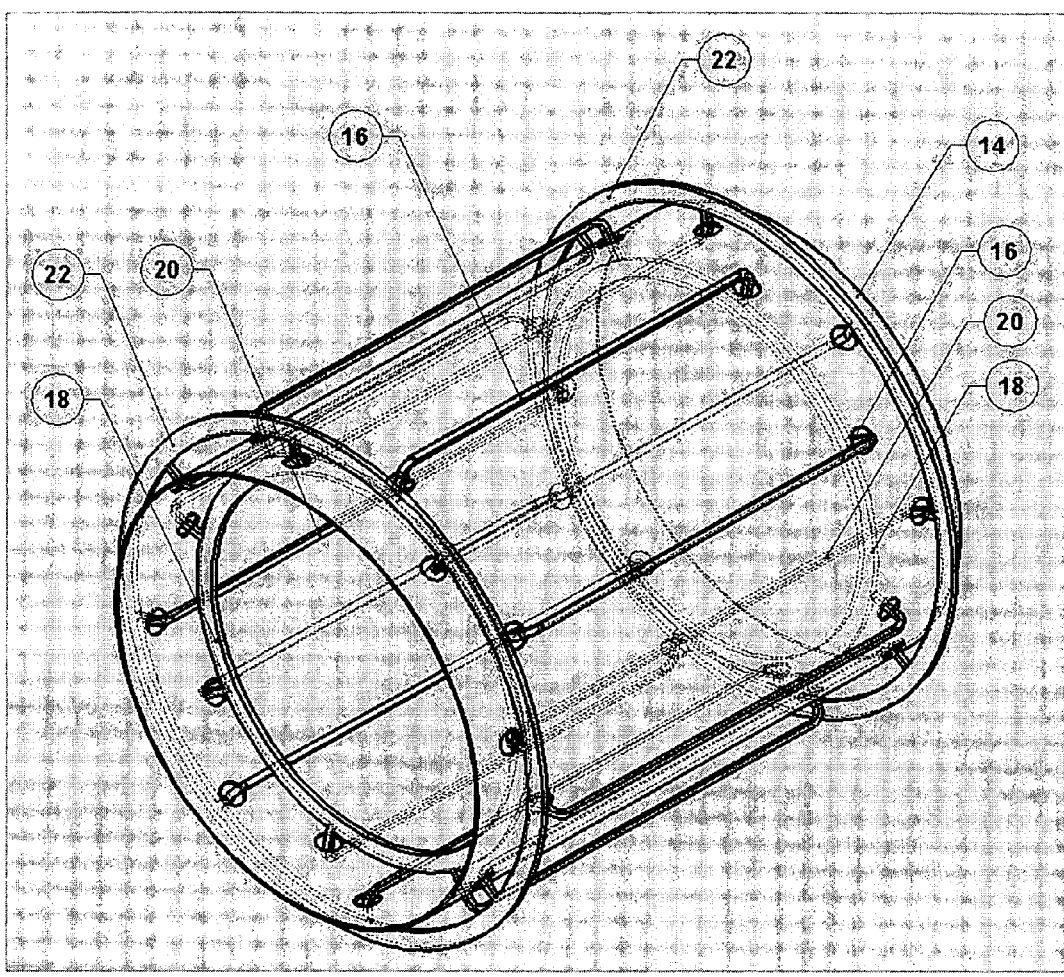
FIG. 3 shows an embodiment of the subject invention incorporating two birdcage coils, one with leg conductors outside the shield and end-ring conductors inside the shield, the other with leg conductors inside the shield and end-ring conductors outside the shield.

In additional embodiments, two or more conductor patterns can be placed in proximity to the same shield. Referring to FIG. 3, two birdcage coils are located proximate the shield 14 such that one birdcage coil has leg conductors 16 outside of the shield and end rings 18 inside of the shield 14, while the second birdcage coil has leg conductors 20 inside the shield 14 and end rings 22 outside the shield 14. The two or more conductor patterns can be driven independently or driven together. The two or more conductor patterns can act as receiving elements, combined or uncombined. Advantageously, embodiments incorporating one or more birdcage coils enjoy the flexibility that the combination of conductor patterns can be optimized by the ability to separate the fields of end-rings from the fields of leg currents. This is in contrast with TEM coils, which have no end-ring currents, and in contrast with unshielded birdcage coils, which have a fixed relationship between end-ring currents and leg currents.

Figure 4:
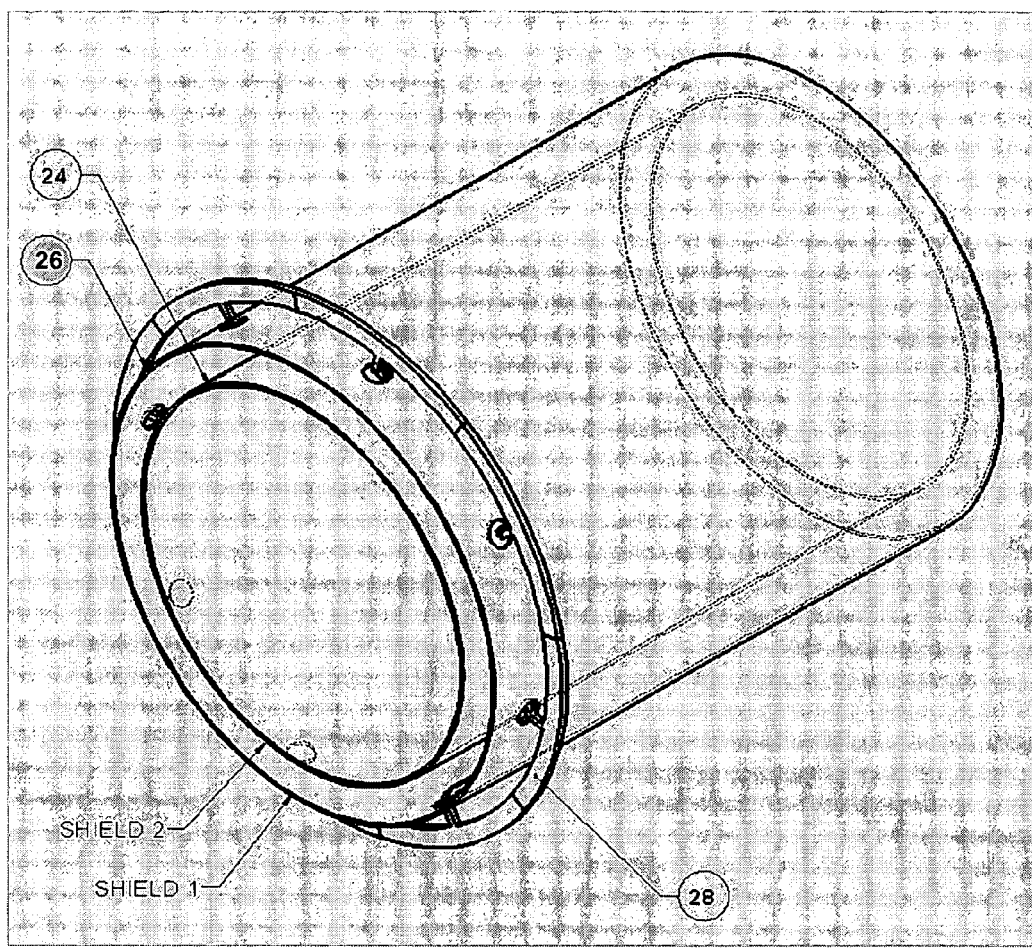
FIG. 4 shows an embodiment of the subject invention incorporating two shields with some conductors (not shown) inside inner shield 2, other conductors (not shown) between outer shield 1 and inner shield 2, and still other conductors outside outer shield 1.

In a further embodiment of the subject invention, multiple shields can be used. The multiple shields can be combinations of complete or partial shields. In an embodiment, the multiple shields can be cylindrical shields located at different radii about a central volume. Such embodiments can allow a larger number of coil structures to occupy more similar volumes without interaction. In an embodiment, referring to FIG. 4, two or more sets of current paths (not shown) can occupy space within a first shield's 24 volume and one set of current paths from a middle set of conductors (not shown) can be located outside the first shield 24. A second shield 26 can be located outside the first shield's 24 volume at a larger radius and outside the middle set of conductors. An outside set of conductors 28 can be positioned outside the second shield 26. In the case where the middle set of conductors and the outside set of conductors can tend to create similar fields and thus be non-isolated, the second shield, which is located between the middle set of conductors and the outside set of conductors, can isolate the middle set of conductors from the outside set of conductors. In an embodiment, one or more of the shields can be made of shielding elements such as, for example, annuli that can be used to minimize interactions between currents that flow around the cylinder. In a specific embodiment, end-ring currents can be at least partially isolated by using an annular shield between the end-rings.

In an embodiment, sets of conductors and/or subsets of conductors can form resonant circuits. The sets of conductors can be made of a plurality of conducting members. The conducting members can be located within a shielding region, pass through the shield, and/or be located outside the shielding region. In an embodiment, conducting members can pass through apertures in the conducting layer of the shield.

In an embodiment, capacitors of relatively low reactances can be used in the shield conductors to prevent unwanted low frequency currents arising, for example, from gradient fields excited during a MRI scan. In a further embodiment the capacitors can also be used for precision tuning and isolation adjustments for the coils that are in close proximity to the shield or the shielding elements.

In an embodiment, the net field inside the shield can be controlled by controlling the excitation phase and amplitude of coil resonant modes, wave guide modes, and/or dielectric resonator modes of the coil structure. The methods for controlling the relative field amplitudes can, for example, include one or more of the following:

driving the coil structure(s) in particular locations to include or exclude known modes;

utilizing extra shields and extra dielectric material inserts to adjust the frequency(s) of modes; and utilizing particular conductive patterns on the shielding structures to allow or prevent certain currents that would be associated with given modes(s).

Although the embodiments shown in FIGS. 1–4 show the coil conductors passing through the shield conductors in the radial direction, embodiments can have the coil conductors pass through the shield conductors in other directions, such as, but not limited to, perpendicular to the radial direction. Although the embodiments shown in FIGS. 1–4 show the shield maintaining a constant radial distance from the axis of the cylindrical shield, embodiments can have the shield have sections with different radial distances.

In a specific embodiment, the leg conductors of the birdcage coil shown in FIG. 1 pass through the shield conductor while the leg conductors are still running longitudinally and the sheath conductor is formed of three cylindrically-shaped sections, a middle section and two end sections, connected by two annular sections lying in planes perpendicular to the axis of the cylindrical sections, with the leg conductors passing through openings in the annular section of the sheath. The leg conductors connect with the end ring such that the end ring has an inner radius smaller than the radius of the middle section of the shield and larger than the radius of the end section of the shield. In a specific embodiment, an additional shield section can be added to connect the distal edge of the end section to the distal edge of the middle section such that the end ring of the birdcage coil is substantially surrounded by the shield.

Although the embodiments shown in FIGS. 1–4 show birdcage type coils, embodiments can incorporate coils known in the art such as, but not limited to, one or more saddle coils, one or more side-to-side coils, and/or one or more top/bottom coils. Examples of saddle coils, side-to-side coils, and top/bottom coils are taught in U.S. Pat. No. 6,836,118, which is hereby incorporated by reference. A specific embodiment can incorporate a pair of saddle coils where the saddle coils have two leg conductors that connect at each end to an end conductor section. The shield can be positioned to shield one or both end conductor sections or to shield one or both of the leg conductors, or some combination thereof.

With respect to the embodiments shown in FIGS. 1–4, the shield can be positioned to shield one ring and not shield the other end ring. Accordingly, in an embodiment, the leg conductors and one end ring can be shielded and in another embodiment one end ring can be shielded. These embodiments of the subject invention and the embodiments shown in FIGS. 1–4, can incorporate a generally cylindrically-shaped shield in specific implementations and can be positioned such that the main static magnetic field is parallel with the axis of the generally cylindrically-shaped shield during MR imaging. Specific embodiments of the invention can be utilized as a head coil. In specific embodiments, coil arrays and shields as shown in FIGS. 1–4 can be utilized as a head coil or other extremity coil.

Embodiments of the RF coil arrays in accordance with the subject invention can be used to receive, or detect, magnetic fields and/or to transmit magnetic fields in, for example a MR imaging system and method.

All patents, patent applications, provisional applications, and publications referred to or cited herein are incorporated by reference in their entirety, including all figures and tables, to the extent they are not inconsistent with the explicit teachings of this specification. It should be understood that the examples and embodiments described herein are for illustrative purposes only and that various modifications or changes in light thereof will be suggested to persons skilled in the art and are to be included within the spirit and purview of this application.

The invention claimed is:

1. A magnetic resonance imaging RF shielded coil array, comprising:
   a plurality of conducting members, wherein the plurality of conducting members are electrically connected and form an RF coil array; and
   an RF shield, wherein the RF shield forms a partially closed volume;
   wherein at least one of the plurality of conducting members is located outside of the partially closed volume such that RF field produced by the at least one of the plurality of conducting members is shielded from the inside of the partially closed volume, wherein at least one of the remaining plurality of conducting members is located inside of the partially closed volume.

2. The RF shielded coil array according to claim 1, wherein the RF shield forms a partially closed cylindrical volume.

3. The RF shielded coil array according to claim 1, wherein the plurality of conducting members comprise a plurality of subgroups of conducting members, wherein at least one of the plurality of subgroups of conducting members forms a resonant circuit.

4. The RF shielded coil array according to claim 1, wherein the RF coil array has associated with it at least one mode selected from the following group: a waveguide mode and a dielectric resonator mode.

5. The RF shielded coil array according to claim 1, wherein the RF coil array has associated with it a coil resonant mode.

6. The RF shielded coil array according to claim 5, further comprising a means for controlling the RF field within the partially closed volume, wherein the means for controlling the RF field controls the excitation phase and amplitude of the coil resonant mode, the wave guide mode and/or dielectric resonator mode.

7. The RF shielded coil array according to claim 4, further comprising a means for controlling the RF field within the partially closed volume, wherein the means for controlling the RF field controls the excitation phase and amplitude of the wave guide mode and/or dielectric resonator mode.

8. The RF shielded coil array according to claim 2, wherein the partially closed cylindrical volume is a partially closed circular cylindrical volume.

9. The RF shielded coil array according to claim 1, wherein at least two of the plurality of conducting members are electrically connected by a connecting conductor, wherein the connecting conductor passes through the RF shield.

10. The RF shielded coil array according to claim 1, wherein the RF shield comprises capacitors that reduce or prevent low frequency currents.

11. The RF shielded coil array according to claim 6, wherein the means for controlling the RF field within the partially closed volume comprises:
    a drive system for driving one or more of the plurality of conducting members, wherein the drive system drives the one or more of the plurality of conducting members from particular locations such that the means for controlling the RF field includes or excludes known modes.

12. The RF shielded coil array according to claim 1, wherein the RF shield comprises complete, partial, or a combination of complete and partial conducting layers.

13. The RF shielded coil array according to claim 1, further comprising:
    one or more additional RF shields, wherein each of the one or more additional shields comprise complete, partial, or a combination of complete and partial conducting layers.

14. The RF shielded coil array according to claim 13, wherein each of the one or more additional shields comprise complete, partial, or a combination of complete and partial conducting layers.

15. The RF shielded coil array according to claim 13, further comprising:
    additional plurality of conducting members, wherein the one or more additional shields and the additional plurality of conducting members adjusts the frequency or frequencies of a mode.

16. The RF shielded coil array according to claim 13, wherein the partially closed volume is a partially closed cylindrical volume, wherein the one or more additional shields are each located at a different radius about the partially closed cylindrical volume.

17. The RF shielded coil array according to claim 15, wherein one or more of the additional plurality of conducting members are located between the RF shield and one of the one or more additional RF shields.

18. The RF shielded coil array according to claim 17, wherein one or more of the remaining conducting members of the additional plurality of conducting members are located outside of the one or more of the additional shields.

19. The RF shielded coil array according to claim 6, wherein the means for controlling the RF field within the partially closed volume comprises:
    particular conductive patterns on the RF shield for allowing or preventing current associated with a mode on the RF shield.

20. The RF shielded coil array according to claim 1, wherein the RF coil array is a volume coil, wherein parts of the volume coil are located inside the partially closed volume and other parts of the volume coil are located outside the partially closed volume.

21. The RF shielded coil array according to claim 20, wherein the volume coil is a birdcage coil, wherein the birdcage coil comprises a plurality of leg conductors, a first end-ring, and a second end-ring.

22. The RF shielded coil array according to claim 21, wherein the plurality of leg conductors are located inside the partially closed volume and the first end-ring and second end-ring are located outside the partially closed volume.

23. The RF shielded coil array according to claim 21, wherein one or more of the plurality of leg conductors are located outside the partially closed volume and the first end-ring and second end-ring are located inside the partially closed volume.

24. The RF shielded coil array according to claim 21, wherein the plurality of leg conductors and the second end-ring are located inside the partially closed volume and the first end-ring is located outside the partially closed volume.

25. The RF shielded coil array according to claim 21, wherein one or more of the plurality of leg conductors and the second end-ring are located outside the partially closed volume and the first end-ring is located inside the partially closed volume.

26. The RF shielded coil array according to claim 1, further comprising a second plurality of conducting members, wherein the second plurality of conducting members are electrically connected and form a second RF coil array, wherein at least one of the second plurality of conducting members is located outside of the partially closed volume and at least one of the remaining second plurality of conducting members is located inside of the partially closed volume.

27. The RF shielded coil array according to claim 20, wherein the RF coil array and the second RF coil array are driven independently, driven together, or act as combined or uncombined receiving elements.

28. The RF shielded coil array according to claim 27, further comprising a means for precision tuning and isolation adjustments for the two or more conductor patterns.

29. The RF shielded coil array according to claim 27, wherein the means for precision tuning and isolation adjustments comprises capacitors.

30. The RF shielded coil array according to claim 1, wherein the RF shield allows gradient fields to pass through.

31. The RF shielded coil array according to claim 1, wherein the RF shield comprises a plurality of shielding structures.

32. The RF shielded coil array according to claim 1, wherein the RF shield comprises a conducting layer.

33. The RF shielded coil array according to claim 1, wherein the RF shield is non-resonant and low impedance.

34. A method for detecting magnetic fields in a magnetic resonance imaging system comprising:
    positioning a plurality of conducting members in a region of interest, wherein the plurality of conducting members are electrically connected and form an RF coil array;
    positioning an RF shield in the region of interest, wherein the RF shield forms a partially closed volume; wherein at least one of the plurality of conducting members is located outside of the partially closed volume such that RF field produced by the at least one of the plurality of conducting members is shielded from the inside of the partially closed volume, wherein at least one of the remaining plurality of conducting members is located inside of the partially closed volume; and detecting magnetic fields with the plurality of conducting members.

* * * * *

UNITED STATES PATENT AND TRADEMARK OFFICE
CERTIFICATE OF CORRECTION

| | |
|---|---|
| PATENT NO. | : 7,145,339 B2 |
| APPLICATION NO. | : 11/245500 |
| DATED | : October 7, 2005 |
| INVENTOR(S) | : Charles A. Saylor and G. Randy Duensing |

It is certified that error appears in the above-identified patent and that said Letters Patent is hereby corrected as shown below:

<u>On Title Page, Item (54)</u>
Lines 1-2,

"METHOD AND APPARATUS FOR DISCRETE SHIELDING
OF VOLUME RFCOIL ARRAYS"

should read

--METHOD AND APPARATUS FOR DISCRETE SHIELDING
OF VOLUME RF COIL ARRAYS--.

Signed and Sealed this

Tenth Day of April, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,145,339 B2 | Page 1 of 1 |
| APPLICATION NO. | : 11/245500 | |
| DATED | : December 5, 2006 | |
| INVENTOR(S) | : Charles A. Saylor and G. Randy Duensing | |

It is certified that error appears in the above-identified patent and that said Letters Patent is hereby corrected as shown below:

<u>On Title Page, Item (54)</u>
Lines 1-2,

"METHOD AND APPARATUS FOR DISCRETE SHIELDING
OF VOLUME RFCOIL ARRAYS"

should read

--METHOD AND APPARATUS FOR DISCRETE SHIELDING
OF VOLUME RF COIL ARRAYS--.

This certificate supersedes Certificate of Correction issued April 10, 2007.

Signed and Sealed this

Eighth Day of May, 2007

JON W. DUDAS
*Director of the United States Patent and Trademark Office*